United States Patent [19]

Miyamura et al.

[11] Patent Number: 5,055,378

[45] Date of Patent: * Oct. 8, 1991

[54] SOLDER RESIST COMPOSITION

[75] Inventors: Masataka Miyamura, Kamakura; Yusuke Wada, Tokyo; Toshiharu Nakagawa, Ayase; Yuji Nakaizumi, Kawasaki; Kazuhiro Takeda, Higashine, all of Japan

[73] Assignee: Kabushiki Kaisha Toshiba, Kawasaki, Japan

[*] Notice: The portion of the term of this patent subsequent to May 15, 2007 has been disclaimed.

[21] Appl. No.: 269,682

[22] Filed: Nov. 10, 1988

[30] Foreign Application Priority Data

Nov. 13, 1987 [JP] Japan .................................. 62-288103
Jun. 7, 1988 [JP] Japan .................................. 63-139953

[51] Int. Cl.$^5$ ...................... G03C 1/725; G03C 1/73; C08F 2/46; C08J 3/28
[52] U.S. Cl. .................................. 430/280; 522/100; 522/103; 522/77
[58] Field of Search ................ 430/280; 522/100, 103, 522/77

[56] References Cited

U.S. PATENT DOCUMENTS 4,816,496 3/1989 Wada et al. .......................... 522/100
4,925,773 5/1990 Miyamura et al. ................. 522/103

FOREIGN PATENT DOCUMENTS 3535770 4/1986 Fed. Rep. of Germany .
3613107 10/1986 Fed. Rep. of Germany .
2175908 12/1986 United Kingdom .

*Primary Examiner*—Marion E. McCamish
*Assistant Examiner*—Mark A. Chapman
*Attorney, Agent, or Firm*—Oblon, Spivak, McClelland, Maier & Neustadt

[57] ABSTRACT

A solder resist composition contains a specified partially acrylated and/or methacrylated bisphenol A novolak epoxy resin component, and a specified partially acrylated and/or methacrylated cresol novolak and/or phenol novolak epoxy resin component. The composition further contain a photopolymerization initiator, a thermosetting agent, an inorganic filler, and an organic solvent. The composition may further include a silane or titanate coupling agent.

22 Claims, No Drawings

SOLDER RESIST COMPOSITION

BACKGROUND OF THE INVENTION

1. Field of the Invention

The present invention relates to a solder resist composition used for a printed-circuit board

2. Description of the Prior Art

In the manufacture of a printed-circuit board, a patterned protective film formed of a solder resist is formed on a printed-circuit board in order to protect the electric circuit and to prevent a solder from being attached to an undesired portion in the step of soldering an electric part to the printed-circuit board.

It was customary to employ a screen printing method for forming a patterned layer of a solder resist. With recent progress in the high densification of the circuit in the printed-circuit board, a photo-setting acrylate or methacrylate solder resist capable of patterning by a photoetching method has been developed in place of the conventional screen printing solder resist The newly developed solder resist permits forming a fine pattern of high dimensional accuracy and high resolution at a high density. In the case of using the newly developed solder resist, the surface of a printed-circuit substrate is coated with the solder resist, followed by selectively exposing the solder resist film in a desired pattern to light using a negative mask so as to photoset the exposed portion. Then, the non-exposed portion is dissolved in a developing liquid and removed so as to form a solder resist pattern The photo-setting acrylate resin certainly exhibits excellent properties when used as a solder resist, but is not sufficiently satisfactory in, for example, electrical properties, solder heat resistance and humidity resistance.

A solder resist intended to overcome the above-noted difficulties is proposed in Japanese Patent Disclosure 60-208377. The proposed resist comprises the reaction product between a phenol novolak type epoxy resin and an unsaturated monobasic acid, the reaction product between a cresol novolak type epoxy resin and an unsaturated monobasic acid, a photopolymerization initiator, an amine type curing agent and an organic solvent. However, the phenol novolak type epoxy resin is lower in solubility in an organic solvent than the cresol novolak type epoxy resin. The reaction product between the phenol novolak type epoxy resin and an unsaturated monobasic acid is still lower in solubility in an organic solvent As a result, the kind of solvent used as a developing liquid of the solder resist is much restricted. To be more specific, a nonflammable developing liquid such as 1,1,1-trichloroethane, trichloroethylene or tetrachloroethane is generally used in view of the safety in the manufacturing process of a printed-circuit board. Since the solder resist disclosed in the prior art quoted above is low in solubility in such a nonflammable developing liquid, the development takes a long time. The reaction product between the cresol novolak type epoxy resin and an unsaturated monobasic acid is also low in its solubility, though not so low as the phenol-novolak resin, and not satisfactory in its thermosetting properties.

Further, Japanese Patent Disclosure No. 62-4390 discloses a curable resin composition for a solder resist ink. The composition comprises a solution containing the reaction product of a phenol novolak type epoxy resin or a cresol novolak type epoxy resin with an unsaturated monobasic acid, dissolved in an organic solvent and/or photopolymerizable polyfunctional vinyl monomer. A photopolymerization initiator and an amine during agent are added to the solution. The resin composition will be accompanied by disadvantages similar to those of the Japanese Patent Disclosure 60-208377.

Japanese Patent Publication No. 60-32360 discloses a solder resist composition comprising the reaction product of an aromatic polyepoxide with an ethylenically unsaturated carboxylic acid, an inorganic filler, a photopolymerization initiator, and an organic solvent. The composition is insufficient in electrical properties and solder heat resistance, in particular.

SUMMARY OF THE INVENTION

An object of the present invention is to provide a solder resist composition excellent in its developing properties, photoetching properties, electrical properties of the solder resist pattern after the photo-setting, solder heat resistance, humidity resistance and mechanical strength.

According to the present invention, there is provided a solder resist comprising (a) a partially acrylated and-/or methacrylated bisphenol. A novolak epoxy resin in which 0.1 to 0.9 equivalents of acrylic acid and/or methacrylic acid are adducted per equivalent of the epoxy group of the epoxy resin; (b) a partially acrylated and/or methacrylated cresol novolak and/or phenol novolak epoxy resin in which 0.1 to 0.9 equivalents of acrylic acid and/or methacrylic acid are adducted per equivalent of the epoxy group of the epoxy resin; (c) a photopolymerization initiator; (d) a thermosetting agent; (e) an inorganic filler; and (f) an organic solvent.

The solder resist composition of the present invention may further comprise (g) a silane coupling agent or a titanate coupling agent in addition to components (a) to (f).

DETAILED DESCRIPTION OF THE PREFERRED EMBODIMENTS

The partially acrylated and/or methacrylated epoxy resin contained as component (a) in the solder resist composition of the present invention is obtained by the addition reaction between bispheno A novolak type epoxy resin and acrylic acid, methacrylic acid or a mixture thereof. The partially acrylated and/or methacrylated epoxy resin (component b) is obtained by the addition reaction between cresol novolak type epoxy resin and/or phenol novolak type epoxy resin and acrylic acid, methacrylic acid or a mixture thereof.

The epoxy resin used as the base material of components (a) and (b) is restricted to bisphenol A novolak type, cresol novolak type and phenol novolak type. Epoxy resins of other types such as epoxy resins of bisphenol A type, bisphenol F type, hydrogenated bisphenol A type, aromatic carboxylic acid diglycidyl ester type should not be used. Where the composition contains a partially acrylated and/or methacrylated epoxy resin prepared by using these undesirable epoxy resins, the solder resist pattern after the photo-setting is low in solder heat resistance.

Components (a) and (b) can be prepared by ordinary reactions. Specifically, component (a) can be prepared by an addition reaction between bisphenol A novolak type epoxy resin and acrylic acid and/or methacrylic acid. The total amount of acrylic acid and/or methacrylic acid should be 0.1 to 0.9, preferably, 0.4 to 0.8 equivalents per equivalent of the epoxy group of the epoxy resin. Likewise, component (b) can be prepared by an addition reaction between cresol novolak type epoxy resin and/or phenol novolak type epoxy resin and acrylic acid and/or methacrylic acid. The total amount of acrylic acid and/or methacrylic acid should be 0.1 to 0.9, preferably, 0.4 to 0.8 equivalents per equivalent of the epoxy group of the epoxy resin. In both cases, if the amount of the acid is less than 0.1 equivalent, the resultant partially acrylated and/or methacrylated epoxy resin becomes low in its photosetting properties, giving rise to swelling of the cured film during the post-cure process after the developing treatment. Where the amount of the acid exceeds 0.9 equivalents, however, a marked degradation takes place in resistance to a developing liquid and a solder heat resistance. Thus, the total amount of the acid is specified as above. It is, however, possible to obtain epoxy resins of desired acrylation or methacrylated degrees by properly controlling the amount of acrylic acid and/or methacrylic acid within the range specified above. It is also possible to improve the developing properties by properly controlling the acrylation or methacrylation degree with a view to the kind of the developing liquid used.

Component (a) can be represented by the formula:

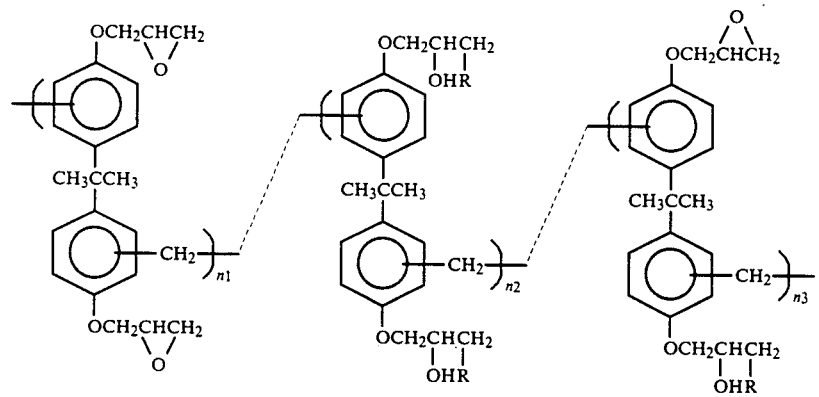

where R is $CH_2=CHCO-$ or $CH_2=C(CH_3)CO-$ and the sum of $n_1$, $n_2$, and $n_3$ is, usually, 7–8 or less.

Component (b) can be represented by the Formula:

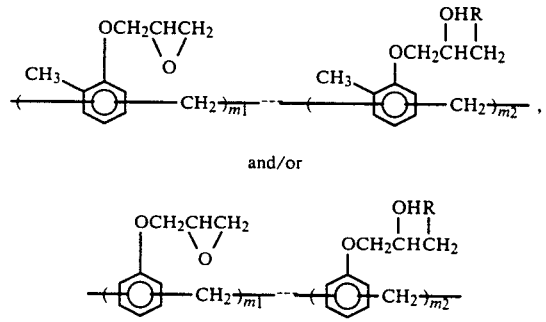

where R is as defined above, and the sum of $m_1$ and $m_2$ is, usually, 7–8 or less.

Component (b) should desirably be used in an amount of 50 to 150, preferably, 60 to 100 parts by weight relative to 100 parts by weight of component (a). The amount failing to fall within the range specified above may give rise to poor photo-setting properties and sensitivity of the resultant solder resist composition, leading to poor properties of the resist film after curing with respect to the surface hardness, heat resistance and resistance to solvent. The incorporation of component (a) leads also to the improvement in developing speed.

The photopolymerization initiator (component c) serves to permit polymerization of components (a) and (b) upon light irradiation. Component (c), which is not particularly restricted in the present invention, includes, for example, carbonyl compounds such as biacetyl, acetophenone, benzophenone, dibenzoyl benzoin-isobutylether, benzildimethylicethnl, (1-hydroxy-cyclohexyl)phenyl ketone, (1-hydroxy-1-methylethyl)-phenyl ketone, and p-isopropyl-c-hydroxyisobutyl phenone. It is also possible to use a ketone and an amine in combination as a complex photopolymerization initiator. The ketone includes, for example, diethyl thioxanthone and ethylanthraquinone, and the amine includes, for example, bis(diethylamino)benzophenone, ethyl(p-dimethylamino)benzoate, benzyldimethylamine and triethanolamine. These compounds can be used singly or in combination. Component (c) should desirably be used in an amount of 1 to 25, preferably, 3 to 20 parts by weight relative to 100 parts by weight of component (a). If the amount of component (c) is less than 1 part by weight, the resultant composition is low in photosetting properties. On the other hand, component (c) mixed in an amount exceeding 25 parts by weight causes the resultant composition after cured to be unsatisfactory in heat resistance, humidity resistance and electrical properties.

Component (d), i.e., a thermosetting agent, serves to crosslink the epoxy groups in the partially acrylated and/or methacrylated epoxy resins, i.e., components (a) and (b), upon heating so as to impart excellent heat resistance, electrical properties and humidity resistance to the epoxy resins. It is possible to use as component (d) a guanidine compound synthesized from dicyandiamide and aromatic amine or an imidazole compound having a diaminotriazine skeleton. The guanidine compound which can be used in the present invention includes, for example, o-tolyl-biguanide, α-2,5-dimethylphenylbiguanide, α,ω-diphenyl-biguanide, 5-hydroxynaphthyl-1-biguanide, p-chlorphenyl-biguanide, α-benzylbiguanide, αmω,-dimethylbiguanide, and 1,3-diphenylguanidine. These guanidine compounds are available on the market as, for example, Hardner HT 2833 and Harder HT 2844, which are trademarks of Chiba Gaigy Co., Ltd. The imidazole compounds having a diaminotriazine skeleton includes, for example, 2,4-diamino-6(2'-methylimidazole-1')ethyl-S-triazine, and 2,4-diamino-6(2'-undecylimidazole-1') ethyl-Striazine. These imidazole compounds are available on the market as, for example, Curezole AZINE, which is a trademark of Shikoku Kasei Kogyo K.K. These guanidine compounds and imidazole compounds having a diaminotriazine skeleton have excellent latent curing properties that they rapidly cure the epoxy resins under high temperatures during heat curing, though they handly exhibit curing properties at lower temperatures Further, an amino derivative or an imidazole derivative can be used as component (d), i.e., a thermosetting agent, singly or in combination with the guanidine compound or imidazole compound described above. The amino derivative noted above includes, for example, diethylenetriamine, triethylenetetramine, diethylaminopropylamine, N-amino-ethylpiperazine, benzylmethylamine, tris(dimethylamino-methyl) phenol, tris(dimethylaminomethyl) phenol, tris-(dimethylaminomethyl) phenol-tri(2-ethylhexoate), metaphenylenediamine, diaminodiphenylmethane, diamino-diphenylsulfone, aromatic-amino eutectic modified curing agent, polyamide resin, dicyandiamide, boron trifluoride-monoethylamine complex, methanediamine, xylenediamine, and bisaminopropyltetraoxaspiroundecane adduct. The imidazole derivative includes ethylmethylimidazole. These amino and imidazole derivatives can be used singly or in combination.

The thermosetting agent (d) should desirably be in an amount of 0.5 to 15, preferably. 1 to 10 parts by weight relative to 100 parts by weight of component (a). If the amount of component (d) is less than 0.5 part by weight, the resultant solder resist composition is low in its photo-setting properties. However, the amount exceeding 15 parts by weight causes reduction in the heat resistance and chemicals resistance of the prepared composition, with the result that deterioration of the solder resist composition is promoted. In addition, the increase in the amount of component (d) brings about an increased manufacturing cost of the composition.

The inorganic filler, i.e., component (e), is used in order to improve the properties of the solder resist such as the solder heat resistance, adhesivity and surface hardness. Component (e) used in the present invention includes, for example, silica, talc, and hydrated alumina. Component (e) should desirably be used in an amount of 10 to 200, preferably, 20 to 100 parts by weight relative to 100 parts by weight of component (a). The inorganic filler, if used in an amount less than 10 parts by weight, fails to perform its function sufficiently. However, if the mixing amount of the inorganic filler exceeds 200 parts by weight, the photo-setting properties of the resultant solder resist composition tend to be deteriorated.

The organic solvent, i.e., component (f), serves to decrease the viscosity of the solder resist composition so as to improve the coating performance of the composition. The organic solvent used in the present invention includes, for example, aromatic hydrocarbons such as toluene and xylene; alcohols such as methanol, isopropylalcohol, ethyleneglycolmonobutylether, and ethyleneglycolmonomethylether; esters such as ethyl acetate and butyl acetate; ethers such as 1,4-dioxane, tetrahydrofuran, and diethyleneglycoldimethylether; ketones such as methylethylketone, and methylisobutylketone; alicyclic compounds such as cyclohexanone, and cyclohexanol; and petroleum solvents such as petroleum ether and petroleum naphtha. The mixing amount of component (f) is not particularly restricted in the present invention. However, it is desirable to use component (f) in an amount of 30 to 200 parts by weight relative to 100 parts by weight of component (a) in order to facilitate the coating of the composition.

In another embodiment of the present invention, a silane coupling agent or a titanate coupling agent is further used as component (g). The use of component (g) makes it possible to provide a solder resist composition of high adhesivity even in the case of using a water-soluble flux. The silane coupling agent used in the present invention includes, for example, vinyl-trichlorosilane, vinyltriethoxysilane, vinyltrimethoxysilane, $\gamma$-methacryloxypropyltrimethoxysilane, $\gamma$-chloro-propyltrimethoxysilane, vinyl-tris ($\beta$-methoxyethoxy) silane, $\beta$-(3,4-epoxycyclohexyl) ethyltrimethoxysilane, $\gamma$-glycidoxypropyltrimethoxysilane, $\gamma$-mercaptopropyltrimethoxysilane, $\gamma$-aminopropyltriethoxysilane, N,$\beta$-(aminoethyl)-$\gamma$-aminopropyltrimethoxysilane, and $\gamma$-ureidopropyltriethoxysilane. On the other hand, the titanate coupling agent used in the present invention includes, for example, bis(triethanolamine) diisopropyl titanate, bis(triethanolamine) dibutyl titanate, bis(triethanolamine) dimethyl titanate, diisopropyl dilauryl titanate, diisopropyl lauryl myristyl titanate, diisopropyl distearoyl titanate, diisopropyl stearoyl methacryloyl titanate, diisopropyl diacryloyl titanate, diisopropyl didodecyl benzene sulfonyl titanate, diisopropyl isostearoyl-4-amino benzoyl titanate, triisopropyl acryloyl titanate, triethyl methacryloyl titanate, triisopropyl myristyl titanate, tributyl dodecyl benzene sulfonyl titanate, triisopropyl stearoyl titanate, and triisopropyl isostearoyl titanate. These coupling agents may be used in combination. Particularly, it is desirable for the coupling agent to have at least one of mercapto group, hydroxy group and amino group attached to the long carbon chain.

The coupling agent, i.e., component (g), should desirably be used in an amount of 0.1 to 4, preferably, 0.2 to 2 parts by weight relative to 100 parts by weight of component (a). Component (g), if used in an amount smaller than 0.1 part by weight, fails to sufficiently exhibit the desired effect. Where the amount exceeds 4 parts by weight, however, the coupling agent tends to give detrimental effect to the shelf life and chemical resistance of the solder resist.

The solder resist composition of the present invention may further contain, as desired, a flame retardant, dye, pigment, defoaming agent, leveling agent, polymerization inhibitor, etc. It is also possible to add peroxides such as lauroyl peroxide, benzoyl peroxide and dicumyl peroxide to the composition in order to increase the density of crosslinkages achieved by the acryl or methacryl group.

In forming a solder resist pattern on a printed-circuit board, the printed-circuit board is coated first with the composition of the present invention, followed by drying so as to evaporate the organic solvent and, thus, to form a solder resist film. Then, the film is selectively exposed to light using a patterned negative mask so as to photo-set the exposed portion of the solder resist film. In general, a light beam having a wavelength of 180 to 700 nm, preferably 250 to 400 nm, is used in this exposing step. The solder resist film after the exposing step is developed with a developing liquid (usually, a nonflammable solvent such as 1,1,1-trichloroethane, trichloroethylene and tetrachloroethane) so as to remove the non-exposed portion of the film, followed by applying a heat treatment so as to completely perform the curing reaction and, thus, to form a solder resist pattern acting as a protective film on the substrate. The heat treatment can be performed at 50° to 220° C., preferably at 100° to 200° C.

The solder resist composition of the present invention can be particularly suitably used for mounting an electronic component on a printed-circuit board having through holes. In this case, a printed-circuit board is prepared first which has predetermined printed-circuits on both surfaces and also interconnection layers on the inner walls of the through holes. The solder resist composition is coated on the both surfaces of the board and dried to remove the organic solvent. Then UV light is selectively irradiated only on that portions of the resist film which correspond to the through holes, and the exposed portions are cured. The non-exposed portions of the resist film are removed with a non-flammable developing liquid. The remaining resist pattern is then cured by heating. The pins of the electronic component are inserted into the through holes and soldered.

To reiterate, the solder resist composition of the present invention comprises components (a) to (f), with the result that the composition is excellent in its photo-etching properties, electrical properties of the solder resist pattern after the curing treatment, solder heat resistance and humidity resistance. In addition, the composition of the present invention exhibits a high mechanical strength. Particularly, the composition is enabled to exhibit a markedly improved developing speed and resistance to a developing liquid of the cured film, since it contains epoxy resins having acrylic acid and/or methacrylic acid added thereto is used as component (a) and (b).

Component (d) i.e., a thermosetting agent, of the composition can be provided by a guanidine compound or an imidazole compound having a diaminotriazine skeleton. These compounds exhibit in particular latent curing properties and rapid curing properties at high temperatures. It follows that the composition of the present invention exhibits a good heat resistance and retains a high bonding strength, even if a water-soluble flux is used in the step of soldering electric parts to the solder resist film formed in advance on the printed-circuit board. Incidentally, component (d) can be added to the composition containing the other component only at a time when the composition of the invention is used.

Further, the composition of the present invention can further contain a silane coupling agent or a titanate coupling agent as component (g). Component (g) covers the surface of the inorganic filler, i.e., component (e), by means of chemical bond and is chemically bonded with the epoxy group, acryl group and methacryl group of the base resin of components (a) and (b), i.e., partially acrylated and/or methacrylated epoxy resin. As a result, the inorganic filler dispersed in the solder resist composition and the base resin are strongly bonded to each other at the interface, leading to improved leveling properties after the printing step. It should also be noted that the solder resist film is not peeled off even if a water-soluble flux is used in the step of soldering electric parts to the printed-circuit substrate covered with the solder resist film, making it possible to mount the electric parts to the printed-circuit substrate satisfactorily.

The partially acrylated and/or methacrylated epoxy resins, i.e., components (a) and (b), used in the present invention are synthesized as follows:

SYNTHETIC EXAMPLE 1

1000 parts by weight of Epicron N-880 (trademark of bisphenol A novolak type epoxy resin having 210 epoxy equivalents, which is manufactured by Dai Nippon Ink & Chemicals Inc.) was dissolved in 200 parts by weight of toluene by heating to 100° C., followed by further dissolving parts by weight of p-methoxyphenol and 5 parts by weight of triphenylphosphine in the resultant solution. Further, 171 parts by weight (2.381 equivalents) of acrylic acid was added to the solution which was kept at 90° C. while blowing air thereinto. The reaction was performed at 90° C. for 5 hours so as to synthesize a 50% acrylated epoxy resin (A-1), i.e., component (a).

SYNTHETIC EXAMPLE 2

A 80% acrylated epoxy resin (A-2), i.e., component (a), was synthesized as in Synthetic Example 1, except that 274 parts by weight (3.81 equivalents) of acrylic acid was added relative to 1000 parts by weight of Epicron N-880 (trademark).

SYNTHETIC EXAMPLE 3

1000 parts by weight of "Epicoat E 157 H 75" (trademark of bisphenol A novolak type epoxy resin having 210 epoxy equivalents, which is manufactured by Yuka-Shell Epoxy K.K.) was dissolved in 200 parts by weight of toluene by heating to 100° C., followed by further dissolving 2 parts by weight of p-methoxyphenol and 5 parts by weight of triphenylphosphine in the resultant solution. Further, 274 parts by weight (3.81 equivalents) of acrylic acid was added to the solution which was kept at 90° C. while blowing air thereinto. The reaction was performed at 90° C. for 5 hours so as to synthesize a 80% acrylated epoxy resin (A-3), i.e., component (a).

SYNTHETIC EXAMPLE 4

1000 parts by weight of "Epicron N-690" (trademark of cresol novolak type epoxy resin having 214 epoxy equivalents, which is manufactured by Dai Nippon Ink & Chemicals Inc.) was dissolved in 100 parts by weight of a solvent naphtha by heating to 120° C., followed by further dissolving 2 parts by weight of p-methoxyphenol and 7 parts by weight of triphenylphosphine in the resultant solution. Further, 269 parts by weight (3.738 equivalents) of acrylic acid was added to the solution which was kept at 95° C. while blowing air thereinto. The reaction was performed at 95° C. for hours so as to synthesize a 80% acrylated epoxy resin (B-1), i.e., component (b).

SYNTHETIC EXAMPLE 5

1000 parts by weight of "Epicron N-770" (trademark of phenol novolak type epoxy resin having 186 epoxy equivalents, which is manufactured by Dai Nippon Ink & Chemicals Inc.) was dissolved in 100 parts by weight of a solvent naphtha by heating to 120° C., followed by further dissolving 2 parts by weight of p-methoxyphenol and 5 parts by weight of triphenylphosphine in the resultant solution. Further, 194 parts by weight (2.69 equivalents) of acrylic acid was added to the solution which was kept at 95° C. while blowing air thereinto. The reaction was performed at 95° C. for hours so as to synthesize a 50% acrylated epoxy resin (B-2), i.e., component (b).

SYNTHETIC EXAMPLE 6

1000 parts by weight of "Epicron N-770" (trademark) was dissolved in 100 parts by weight of a solvent naphtha by heating to 120° C., followed by further dissolving 2 parts by weight of p-methoxyphenol and 5 parts by weight of triphenylphosphine in the resultant solution. Further, 310 parts by weight (4.30 equivalents) of acrylic acid was added to the solution which was kept at 95° C. while blowing air thereinto. The reaction was performed at 95° C. for 5 hours so as to synthesize a 80% acrylated epoxy resin (B-3), i.e., component (b).

SYNTHETIC EXAMPLE 7

A mixture consisting of 500 parts by weight of "Epicron N-830" (trademark of bisphenol F epoxy resin having 180 epoxy equivalents, which is manufactured by Dai Nippon & Chemicals Inc.), 1 part by weight of p-methoxy-phenol and 5 parts by weight of triphenylphosphine was heated to 100° C. to prepare a solution. Further, 160 parts by weight (2.222 equivalents) of acrylic acid was added to the solution which was kept at 95° C. while blowing air thereinto. The reaction was performed at 95° C. for 5 hours so as to synthesize a 80% acrylated epoxy resin (C-1).

SYNTHETIC EXAMPLE 8

1000 parts by weight of "Epicron 860" (trademark of bisphenol A epoxy resin having 250 epoxy equivalents, which is manufactured by Dai Nippon & Chemicals Inc.) was dissolved in 100 parts by weight of toluene by heating to 100° C., followed by further dissolving 2 parts by weight of p-methoxyphenol and 5 parts by weight of triphenyl-phosphine in the resultant solution. Further, 230 parts by weight (3.194 equivalents) of acrylic acid was added to the solution which was kept at 95° C. while blowing air thereinto. The reaction was performed at 95° C. for 5 hours so as to synthesize a 80% acrylated epoxy resin (C-2).

EXAMPLE 1

A solder resist main body was prepared by mixing 60 parts by weight of epoxy resin (A-1) prepared in Synthetic Example 1, 60 parts by weight of epoxy resin (B-1) prepared in Synthetic Example 4, 6 parts by weight of benzildimethylketal, 2 parts by weight of diethylthioxantone, 1.5 parts by weight of phthalocyanine green, 2 parts by weight of silica powder, 20 parts by weight of talc and 50 parts by weight of ethyleneglycol-mono-n-butylether, followed by kneading the mixture with rolls. Added to the resultant solder resist main body was a solution prepared by dissolving 2.0 parts by weight of "2E4MZ" (trademark of ethylmethylimidazole manufactured by Shikoku Kasei Kogyo K.K.) in 20 parts by weight of ethyleneglycolmono-n-butylether. The mixture was stirred so as to prepare a solder resist composition.

Then, the entire surface of an IPC-B-25 test circuit substrate was coated with the solder resist composition by a screen printing method in a thickness of 35 µm. The coating was dried at 80° C. for 30 minutes to form a solder resist film, followed by selectively exposing the film for 100 seconds to an ultraviolet light of 10 mW/cm$^2$ emitted from a high pressure mercury lamp. A negative mask was used in this selective exposing step. After the selective exposure, the solder resist film was developed for 30 seconds with "Ethana 1R" (trademark of 1,1,1-trichloroethane mixed solvent manufactured by Asahi Kasei K.K.), followed by thermosetting the film at 150° C. for 1 hour so as to form a cured solder resist pattern precisely conforming with the negative mask.

EXAMPLE 2

A solder resist pattern was formed as in Example 1, except that epoxy resins (A-1) and (B-2) prepared in Synthetic Examples were used as components (a) and (b), respectively. The cured solder resist pattern was found to precisely conform with the negative mask.

EXAMPLE 3

A solder resist pattern was formed as in Example 1, except that epoxy resins (A-2) and (B-1) prepared in Synthetic Examples were used as components (a) and (b), respectively. The cured solder resist pattern was found to precisely conform with the negative mask.

EXAMPLE 4

A solder resist pattern was formed as in Example 1, except that epoxy resins (A-2) and (B-2) prepared in Synthetic Examples were used as components (a) and (b), respectively. The cured solder resist pattern was found to precisely conform with the negative mask.

COMPARATIVE EXAMPLE 1

A solder resist pattern was formed as in Example 1, except that 60 parts by weight of epoxy resin (B-1) and 60 parts by weight of epoxy resin (C-1) prepared in Synthetic Examples were used as partially acrylated epoxy resins. The solder resist pattern was found to partially swell in the thermosetting stage.

COMPARATIVE EXAMPLE 2

A solder resist pattern was formed as in Example 1, except that 60 parts by weight of epoxy resin (C-1) and 60 parts by weight of epoxy resin (C-2) prepared in Synthetic Examples were used as partially acrylated epoxy resins. The solder resist pattern was found to partially swell in the thermosetting stage The printed-circuit substrates of Examples 1 to 4 and Comparative Examples 1 and 2 having the solder resist patterns formed thereon were tested for checkers tape peeling, heat resistance, pencil hardness and insulating properties as follows. Table 1 shows the results.

i. Checkers Tape Peeling Test

As specified in JIS (Japanese Industrial Standards) D-0202, a peeling test using a cellophane tape was applied to a test piece with a checkers-shaped cross cut. The denominator and numerator shown in Table 1 represent the number of tested samples and the number of test pieces in which peeling did not take place after the test, respectively.

ii. Heat Resistance Test L 10 The test piece was put three times, each time for 20 seconds, in a solder bath of 260° C. to observe the change in the appearance and adhesivity of the coated film. A rosin type flux was used in this test.

iii. Pencil Hardness Test

As specified in JIS K-5400, the highest hardness at which the film of the solder resist pattern was not scratched was determined by a pencil hardness tester under a load of 1 Kg.

iv. Insulation Test

The electrical resistance of the test piece was measured in two cases, i.e., (1) under the state of IPC-SM-840 method 2.5.23, and (2) after the test piece was held for 7 days under a temperature of 50° C. and a relative humidity of 95%.

TABLE 1

| | Examples | | | | Comparative Examples | |
|---|---|---|---|---|---|---|
| | 1 | 2 | 3 | 4 | 1 | 2 |
| Partially Acrylated Epoxy Resin | | | | | | |
| A-1 | 60 | 60 | — | — | — | — |
| A-2 | — | — | 60 | 60 | — | — |
| B-1 | 60 | — | 60 | — | 60 | — |
| B-2 | — | 60 | — | 60 | — | — |
| C-1 | — | — | — | — | 60 | 60 |
| C-2 | — | — | — | — | — | 60 |
| Benzildimethylketal | 6 | 6 | 6 | 6 | 6 | 6 |
| Diethylthio-xantone | 2 | 2 | 2 | 2 | 2 | 2 |
| Ethylmethyl-imidazole | 2 | 2 | 2 | 2 | 2 | 2 |
| Phthalocyanine green | 1.5 | 1.5 | 1.5 | 1.5 | 1.5 | 1.5 |
| Silica Powder | 2 | 2 | 2 | 2 | 2 | 2 |
| Talc | 20 | 20 | 20 | 20 | 20 | 20 |
| Ethyleneglycol mono-n-butyl ether | 70 | 70 | 70 | 70 | 70 | 70 |
| Checkers tape peeling test | 100/100 | 100/100 | 100/100 | 100/100 | * | * |
| Heat resistance test | o | o | o | o | * | * |
| Pencil hardness test | 5H | 5H | 5H | 5H | * | * |
| Insulating Properties | | | | | | |
| (1) | $4.5 \times 10^{14}$ | $2.7 \times 10^{14}$ | $7.3 \times 10^{14}$ | $6.5 \times 10^{14}$ | * | * |
| (2) | $8.3 \times 10^{13}$ | $5.2 \times 10^{11}$ | $6.0 \times 10^{11}$ | $4.7 \times 10^{11}$ | * | * |

*Impossible to measure (swelling took place in the heat curing step)

As apparent from Table 1, the cured solder resist patterns formed in Examples 1 to 4 exhibit excellent bonding strength to the substrate, heat resistance, hardness and insulating properties.

EXAMPLE 5

A solder resist main body was prepared by mixing 60 parts by weight of epoxy resin (A-3) prepared in Synthetic Example 3, 60 parts by weight of epoxy resin (B-3) prepared in Synthetic Example 6, 6 parts by weight of benzildimethylketal, 2 parts by weight of diethylthioxantone, 2 parts by weight of bis(diethylamino) benzophenone, 1.5 parts by weight of phthalocyanine green, 3 parts by weight of silica powder, 60 parts by weight of talc and 50 parts by weight of ethyleneglycol-mono-n-butylether, followed by kneading the mixture with rolls. Added to the resultant solder resist main body was a solution prepared by dissolving 1.2 parts by weight of "Hardner HT2844" (trademark of a guinidine type curing agent manufactured by Chiba Gaigy K.K.) in 20 parts by weight of ethyleneglycol-mono-n-butylether. The mixture was stirred so as to prepare a solder resist composition.

Then, the entire surface of an IPC-B-25 test circuit substrate was coated with the solder resist composition by a screen printing method in a thickness of 35 μm. The coating was dried at 80° C. for 30 minutes to form a solder resist film, followed by selectively exposing the film for 100 seconds to an ultraviolet light of 10 mW/cm² emitted from a high pressure mercury lamp. A negative mask was used in this selective exposing step. After the selective exposure, the solder resist film was developed for 30 seconds with "Ethana IR" (trademark), followed by thermosetting the film at 140° C. for 1 hour so as to form a cured solder resist pattern precisely conforming with the negative mask.

EXAMPLE 6

A solder resist pattern was formed as in Example 5, except that 3.8 parts by weight of "Curezoe C11Z-AZINE", which is a trademark of 2,4-diamino-6-(2'-undecylimidazole-1') ethyl-S-triazine manufactured by Shikoku Kasei Kogyo K.K.) and 1.0 part by weight of diaminodiphenylmethane were used as the curing agent of component (d) in place of "Hardner HT2844" (trademark) used in Example 5. The cured solder resist pattern was found to precisely conform with the negative mask.

EXAMPLE 7

A solder resist pattern was formed as in Example 5, except that 0.6 part by weight of "Hardner HT2844" (trademark) and 3.0 parts by weight of diaminodiphenylmethane were used as the curing agent of component (d). The cured solder resist pattern was found to precisely conform with the negative mask.

REFERENCE EXAMPLE 1

A solder resist pattern was formed as in Example 5, except that 6 parts by weight of diaminodiphenylmethane was used as the curing agent of component (d).

REFERENCE EXAMPLE 2

A solder resist pattern was formed as in Example 5, except that 6 parts by weight of diaminodiphenylsulfone was used as the curing agent of component (d).

The printed-circuit substrates of Examples 5 to 7 and Reference Examples 1 and 2 having the solder resist patterns formed thereon were tested for checkers tape peeling, heat resistance, pencil hardness and insulating properties as in the previous tests. In these tests, the heat resistance was measured in two cases, i.e., (1) use of rosin type flux, and (2) use of a water-soluble flux. Table 2 shows the results.

TABLE 2

| | Examples | | | Reference Examples | |
|---|---|---|---|---|---|
| | 5 | 6 | 7 | 1 | 2 |
| Partially Acrylated Epoxy Resin | | | | | |
| A-3 | 60 | 60 | 60 | 60 | 60 |
| B-3 | 60 | 60 | 60 | 60 | 60 |
| Benzildimethylketal | 6 | 6 | 6 | 6 | 6 |
| Diethylthio-xantone | 2 | 2 | 2 | 2 | 2 |
| Bis(diethylamino) benzophenone | 2 | 2 | 2 | 2 | 2 |
| Hardner HT 2844* | 1.2 | — | 0.6 | — | — |
| Curezole $C_{11}$-Z-AZINE** | — | 3.8 | — | — | — |
| Diaminodiphenyl methane | — | 1.0 | 3.0 | 6.0 | — |
| Diaminodiphenyl sulfone | — | — | — | — | 6.0 |
| Phthalocyanine green | 1.5 | 1.5 | 1.5 | 1.5 | 1.5 |
| Silica Powder | 3 | 3 | 3 | 3 | 3 |
| Talc | 60 | 60 | 60 | 60 | 60 |
| Ethyleneglycol mono-n-butyl ether | 70 | 70 | 70 | 70 | 70 |
| Checkers tape | 100/ | 100/ | 100/ | 100/ | 100/ |

TABLE 2-continued

|  | Examples | | | Reference Examples | |
|---|---|---|---|---|---|
|  | 5 | 6 | 7 | 1 | 2 |
| peeling test | 100 | 100 | 100 | 100 | 100 |
| Solder heat resistance | | | | | |
| #1 | o | o | o | o | o |
| #2 | o | o | o | x | x |
| Pencil hardness test | 5H | 5H | 5H | 5H | 5H |
| Insulating Properties | | | | | |
| (1) | $7.5 \times 10^{14}$ | $6.9 \times 10^{14}$ | $7.0 \times 10^{14}$ | $6.5 \times 10^{14}$ | $7.0 \times 10^{14}$ |
| (2) | $6.0 \times 10^{12}$ | $8.6 \times 10^{12}$ | $7.2 \times 10^{12}$ | $8.1 \times 10^{11}$ | $9.7 \times 10^{11}$ |

*Hardner HT 2844 (trademark of Chiba Gaigy K.K.)
**Curezole C$_{11}$Z-AZINE (trademark of Shikoku Kasei Kogyo K.K.)
1 Use of rosin type flux
2 Use of water-soluble flux As apparent from Table 2, the cured solder resist patterns formed in Examples 5 to 7 exhibit excellent bonding strength to the substrate, solder heat resistance, hardness and insulating properties. In addition, the cured solder resist patterns formed in the Examples of the present invention were found to fully withstand the use of a water-soluble flux.

EXAMPLE 8

A solder resist main body was prepared by mixing 0 parts by weight of epoxy resin (A-3) prepared in Synthetic Example 3, 60 parts by weight of epoxy resin (B-3) prepared in Synthetic Example 6, 6 parts by weight of benzildimethylketal, 2 parts by weight of bis(diethylamino) benzophenone, 1.5 parts by weight of phthalocyanine green, 3 parts by weight of silica powder, 60 parts by weight of talc, 1.0 part by weight of γ-aminopropyltriethoxysilane (coupling agent), and 50 parts by weight of ethyleneglycol-mono-n-butylether, followed by kneading the mixture with rolls. Added to the resultant solder resist main body was a solution prepared by dissolving 0.7 part by weight of 2-ethyl-4methylimidazole in 20 parts by weight of ethyleneglycol-mono-n-butylether. The mixture was stirred so as to prepare a solder resist composition.

Then, the entire surface of an IPC-B-25 test circuit substrate was coated with the solder resist composition by a screen printing method in a thickness of 20 μm. The coating was dried at 80° C. for 30 minutes to form a solder resist film, followed by selectively exposing the film to an ultraviolet light of about 500 mJ/cm² emitted from a high pressure mercury lamp. A negative mask was used in this selective exposing step. After the selective exposure, the solder resist film was developed for 30 about seconds with "Ethana 1R" (trademark), followed by thermosetting the film at 140° C. for 1 hour so as to form a cured solder resist pattern precisely conforming with the negative mask.

EXAMPLE 9

A solder resist pattern was formed as in Example 8, except that 1.0 part by weight of γ-mercaptopropyl triethoxy silane was used in place of γ-aminopropyl triethoxy silance used in Example 8. The cured solder resist pattern was found to precisely conform with the negative mask.

EXAMPLE 10

A solder resist pattern was formed as in Example 8, except that 1.0 part by weight of bis(triethanolamine) dibutyl titanate was used in place of γ-aminopropyl triethoxy silance used in Example 8. The cured solder resist pattern was found to precisely conform with the negative mask.

EXAMPLE 11

A solder resist pattern was formed as in Example 8, except that 1.0 part by weight of γ-glycidoxypropyl trimethoxy silane was used in place of γ-aminopropyl triethoxy silance used in Example 8. The cured solder resist pattern was found to precisely conform with the negative mask.

REFERENCE EXAMPLE 3

A solder resist pattern was formed as in Example 8, except that γ-aminopropyl triethoxy silance used in Example 8 as a coupling agent was not mixed in the solder resist composition.

The printed-circuit substrates of Examples 8 to 11 and Reference Example 3 having the solder resist patterns formed thereon were tested for checkers tape peeling, heat resistance, and pencil hardness as in the previous tests. In these tests, the heat resistance was measured in two cases, i.e., (1) use of rosin type flux, and (2) use of a water-soluble flux. Table 3 shows the results.

TABLE 3

|  | Examples | | | | Reference Example |
|---|---|---|---|---|---|
|  | 8 | 9 | 10 | 11 | 3 |
| Partially Acrylated Epoxy Resin | | | | | |
| A-3 | 60 | 60 | 60 | 60 | 60 |
| B-3 | 60 | 60 | 60 | 60 | 60 |
| Benzildimethylketal | 6 | 6 | 6 | 6 | 6 |
| Bis(diethylamino) benzophenone | 2 | 2 | 2 | 2 | 2 |
| 2-ethylmethyl imidazole | 0.7 | 0.7 | 0.7 | 0.7 | 0.7 |
| Phthalocyanine green | 1.5 | 1.5 | 1.5 | 1.5 | 1.5 |
| Silica Powder | 3 | 3 | 3 | 3 | 3 |
| Talc | 60 | 60 | 60 | 60 | 60 |
| γ-aminopropyl triethoxysilane | 1 | — | — | — | — |
| γ-mercaptopropyl triethoxysilane | — | 1 | — | — | — |
| Bis(triethanolamine)dibutyl titanate | — | — | 1 | — | — |
| γ-glycidoxypropyl trimethoxysilane | — | — | — | 1 | — |
| Ethyleneglycol mono-n-butyl ether | 70 | 70 | 70 | 70 | 70 |
| Checkers tape peeling test | 100/100 | 100/100 | 100/100 | 100/100 | 100/100 |
| Solder heat resistance | | | | | |
| #1 | o | o | o | o | o |
| #2 | o | o | o | * | ** |
| Pencil hardness test | 5H | 5H | 5H | 5H | 5H |

*Turned somewhat white
**Turned white; poor in adhesivity
1 Use of rosin type flux
2 Use of water-soluble flux As apparent from Table 3, the cured solder resist patterns formed in Examples 8 to 11 (particularly, Examples 8 to 10) exhibit excellent bonding strength to the substrate, solder heat resistance, and hardness. In addition, the cured solder resist patterns formed in the Examples of the present invention were found to be free of color change into white and to fully withstand the use of a water-soluble flux.

As described above in detail, a film of the solder resist composition of the present invention formed on a substrate is readily cured by the light irradiation in the exposing step and by the heat treatment after the developing step. The cured film is excellent in its bonding strength to the substrate, hardness, solder heat resistance and insulating properties. In addition, the cured film can be developed quite satisfactorily in the image-forming step, making it possible to form a solder resist pattern of high accuracy. It should be noted that a guanidine compound or an imidazole compound having a diaminotriazine skeleton is used as a curing agent in the present invention. As a result, the solder resist composition is enabled to withstand the use of a water-soluble flux and to maintain a high bonding strength. Further, the silane coupling agent or titate type coupling agent used in the present invention permits the composition to improve the leveling properties after the printing step and to sufficiently withstand the use of a water-soluble flux. It follows that the solder resist composition of the present invention can be effectively utilized for forming a protective film on a printed-wiring substrate.

What is claimed is:

1. A solder resist composition, comprising:
   (a) a partially acrylated and/or methacrylated bisphenol A novolak epoxy resin in which 0.1 to 0.9 equivalents of acrylic acid and/or methacrylic acid are adducted to bisphenol A novolak epoxy resin per equivalent of the epoxy group of the epoxy resin;
   (b) a partially acrylated and/or methacrylated cresol novolak and/or phenol novolak epoxy resin in which 0.1 to 0.9 equivalents of acrylic acid and/or methacrylic acid are adducted to cresol novolak and/or phenol novolak epoxy resin per equivalent of the epoxy group of the epoxy resin;
   (c) a photopolymerization initiator in an amount sufficient to photopolymerize said components (a) and (b);
   (d) a thermosetting agent in an amount sufficient to thermally cure said components (a) and (b);
   (e) an inorganic filler; and
   (f) an organic solvent.

2. The composition according to claim 1, wherein said component (b) is present in an amount of 50 to 150 parts by weight based on 100 parts by weight of component (a).

3. The composition according to claim 1, wherein said component (b) is present in an amount of 60 to 100 parts by weight based on 100 parts by weight of said component (a).

4. The composition according to claim 1, wherein said component (c) is present in an amount of 1 to 25 parts by weight based on 100 parts by weight of component (a).

5. The composition according to claim 1, wherein said component (c) is present in an amount of 3 to 20 parts by weight based on 100 parts by weight of said component (a).

6. The composition according to claim 1, wherein said component (d) is present in an amount of 0.5 to 15 parts by weight based on 100 parts by weight of said component (a).

7. The composition according to claim 1, wherein said component (d) is present in an amount of 1 to 10 parts by weight based on 100 parts by weight of said component (a).

8. The composition according to claim 1, wherein said component (e) is present in an amount of 10 to 200 parts by weight based on 100 parts by weight of said component (a).

9. The composition according to claim 1, wherein said component (f) is present in an amount of 30 to 200 parts by weight based on 100 parts by weight of said component (a).

10. The composition according to claim 1, wherein said thermosetting agent (d) includes at least one of a guanidine compound and an imidazole compound having a diaminotriazine skeleton.

11. A solder resist composition, comprising:
    (a) a partially acrylated and/or methacrylated bisphenol A novolak epoxy resin in which 0.1 to 0.9 equivalents of acrylic acid and/or methacrylic acid are adducted to bisphenol A novolak epoxy resin per equivalent of the epoxy group of the epoxy resin;
    (b) a partially acrylated and/or methacrylated cresol novolak and/or phenol novolak epoxy resin in which 0.1 to 0.9 equivalents of acrylic acid and/or methacrylic acid are adducted to cresol novolak and/or phenol novolak epoxy resin per equivalent of the epoxy group of the epoxy resin;
    (c) a photopolymerization initiator;
    (d) a thermosetting agent;
    (e) an inorganic filler;
    (f) an organic solvent; and
    (g) a silane coupling agent or a titanate coupling agent.

12. The composition according to claim 11, wherein said component (b) is present in an amount of 50 to 50 parts by weight based on 100 parts by weight of said component (a).

13. The composition according to claim 11, wherein said component (b) is present in an amount of 60 to 100 parts by weight based on 100 parts by weight of said component (a).

14. The composition according to claim 11, wherein said component (c) is present in an amount of 1 to 25 parts by weight based on 100 parts by weight of said component (a).

15. The composition according to claim 11, wherein said component (c) is present in an amount of 3 to 20 parts by weight based on 100 parts by weight of said component (a).

16. The composition according to claim 11, wherein said component (d) is present in an amount of 0.5 to 15 parts by weight based on 100 parts by weight of said component (a).

17. The composition according to claim 11, wherein said component (d) is present in an amount of 1 to 10 parts by weight based on 100 parts by weight of said component (a).

18. The composition according to claim 11, wherein said component (e) is present in an amount of 10 to 200 parts by weight based on 100 parts by weight of said component (a).

19. The composition according to claim 11, wherein said component (f) is present in an amount of 30 to 200 parts by weight based on 100 parts by weight of said component (a).

20. The composition according to claim 11, wherein said thermosetting agent (d) includes at least one of a guanidine compound and an imidazole compound having a diaminotriazine skeleton.

21. The composition according to claim 11, wherein said component (g) is present in an amount of 0.1 to 4 parts by weight based on 100 parts by weight of said component (a).

22. The composition according to claim 11, wherein said component (g) is present in an amount of 0.2 to 2 parts by weight based on 100 parts by weight of said component (a).

* * * * *